(12) United States Patent
Wu et al.

(10) Patent No.: US 9,368,674 B2
(45) Date of Patent: Jun. 14, 2016

(54) METHOD AND APPARATUS FOR CREATING A W-MESA STREET

(71) Applicant: KONINKLIJKE PHILIPS N.V., Eindhoven (NL)

(72) Inventors: Songnan Wu, Eindhoven (NL); Boris Kharas, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/390,862

(22) PCT Filed: Apr. 5, 2013

(86) PCT No.: PCT/IB2013/052732
§ 371 (c)(1),
(2) Date: Oct. 6, 2014

(87) PCT Pub. No.: WO2013/156891
PCT Pub. Date: Oct. 24, 2013

(65) Prior Publication Data
US 2015/0060888 A1   Mar. 5, 2015

Related U.S. Application Data

(60) Provisional application No. 61/624,424, filed on Apr. 16, 2012.

(51) Int. Cl.
*H01L 33/00*   (2010.01)
*H01L 21/78*   (2006.01)
*H01L 33/24*   (2010.01)

(52) U.S. Cl.
CPC ............ *H01L 33/0095* (2013.01); *H01L 21/78* (2013.01); *H01L 33/24* (2013.01)

(58) Field of Classification Search
CPC ..................................................... H01L 21/78
See application file for complete search history.

(56) References Cited

U.S. PATENT DOCUMENTS

| | | | | |
|---|---|---|---|---|
| 3,628,106 A | * | 12/1971 | Frank et al. | 257/496 |
| 2004/0238926 A1 | | 12/2004 | Obinata | |
| 2006/0223234 A1 | * | 10/2006 | Terayama et al. | 438/113 |
| 2006/0249816 A1 | * | 11/2006 | Li et al. | 257/618 |
| 2007/0111390 A1 | | 5/2007 | Komura et al. | |
| 2007/0272668 A1 | * | 11/2007 | Albelo | B23K 26/0635 219/121.72 |
| 2008/0277765 A1 | | 11/2008 | Lane et al. | |
| 2011/0204488 A1 | | 8/2011 | Itou et al. | |

* cited by examiner

*Primary Examiner* — Jerome Jackson, Jr.
(74) *Attorney, Agent, or Firm* — Patent Law Group LLP; Brian D. Ogonowsky

(57) ABSTRACT

A method for fabricating an epitaxial structure includes providing a wafer comprising one or more epitaxial layers. The wafer is divided into dice where the area between the dice are called streets. Each street has a slot formed on either side of the street. The slots penetrate through the epitaxial layer but not the substrate leaving a portion of the epitaxial layer intact between the slots creating a "W" shaped cross section. A protective layer is then formed on the wafer. A laser may be used to singulate the wafer in to individual dice. The laser divides each street between the slots. The barrier walls of the epitaxial layers protect the individual dice from debris created by laser separation.

7 Claims, 12 Drawing Sheets

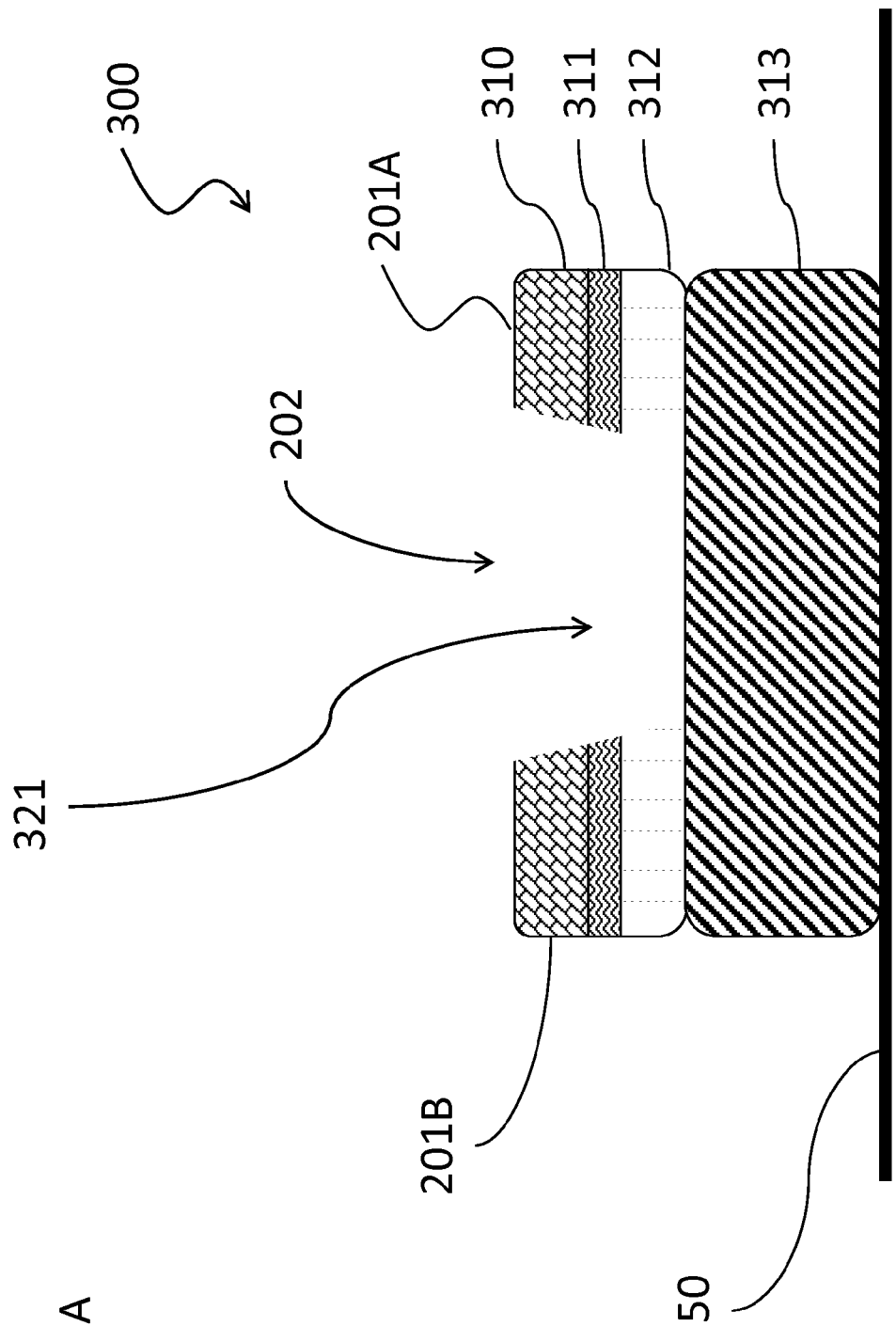

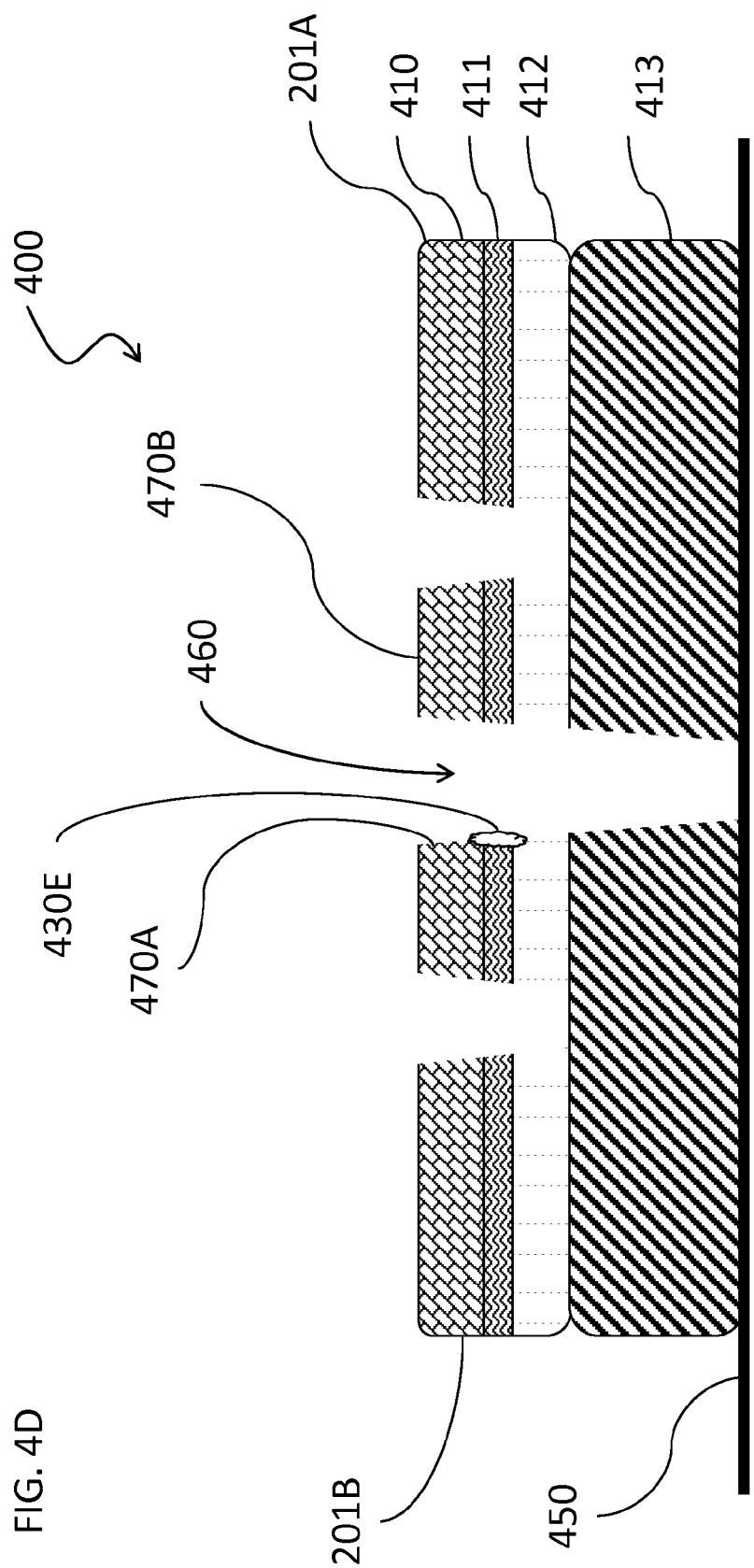

METHOD AND APPARATUS FOR CREATING A W-MESA STREET

CROSS-REFERENCE TO PRIOR APPLICATIONS

This application is the U.S. National Phase application under 35 U.S.C. §371 of International Application No. PCT/IB2013/052732, filed on Apr. 5, 2013, which claims the benefit of U.S. Patent Application No. 61/624,424, filed on Apr. 16, 2012. These applications are hereby incorporated by reference herein.

FIELD OF THE INVENTION

The present disclosure relates to the process used to separate semiconductor dice.

BACKGROUND

Semiconductor devices are typically formed as rectangular dice on a circular wafer. FIG. 1 shows an exemplary wafer 100 including a number of dice 101 (only a few are explicitly numbered). Exemplary dice 101A and 101B are separated by an area 102 often called a "street." Any area between dice is termed a street, including vertical and horizontal areas that continue past several dice 101 and any other suitable areas. A laser may be used to separate the dice by cutting the wafer 100 in the street area 102. However, thermal shock and high temperatures created by the laser may cause portions of the wafer to damage the dice 101 via "thrown" particles or reformed material. It would be desirable to use a method of die separation that causes less damage to the dice 101.

SUMMARY

Separating a wafer of dice, by using a laser is well known. Laser separation may damage some of the dice. A "W" shaped cross section is created by forming two slots on either side of the streets of a wafer of devices. The area between the slots is termed a "mesa." The resulting W-mesa may protect the dice during the laser separation process. After the slots are formed, a protective coating is formed over the entire wafer. Finally a laser is used to separate the dice by dividing the wafer in the center of each mesa. The portions of the mesa which remain may protect the dice from debris generated by the laser separation.

BRIEF DESCRIPTION OF THE DRAWINGS

In the drawings:

FIG. 3A shows a cross-sectional view of a wafer where a "U" shaped street has been etched through the epitaxial layer;

FIG. 4D shows a cross-sectional view of a wafer where a W-mesa shaped street has been separated by a laser generating debris after removal of the protective coating.

Use of the same reference numbers in different figures indicates similar or identical elements.

DETAILED DESCRIPTION

Although any type of semiconductor wafer divided into dice can utilize the invention, the remainder of the description will use a wafer of square LED dice in order to simplify the description. Although the remainder of the description only refers to LEDs, devices may be lasers, solar cells, detectors, DRAM, SRAM, ROM, Flash memory, MEMS devices, microprocessors, logic gates, FPGAs or any other suitable device. Likewise, although a square die shape is described any suitable die shape or shapes are contemplated and are included within the scope of the invention.

Although a substrate with epitaxial layers is shown, other semiconductor constructions utilizing non-epitaxial layers e.g. amorphous layers, are contemplated and are included within the scope of the invention. Although a wafer with epitaxial layers and a substrate are shown, other configurations such as a wafer of devices mounted or bonded to a wafer of submounts are contemplated and are included within the scope of the invention.

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, arsenic, and phosphorus. Often III-nitride devices are epitaxially grown on sapphire, silicon carbide, or III-nitride substrates and III-phosphide devices are epitaxially grown on gallium arsenide by metal organic chemical vapor deposition (MOCVD), molecular beam epitaxy (MBE) or other epitaxial techniques. Often, an n-type region is deposited on the substrate, then an active region is deposited on the n-type region, then a p-type region is deposited on the active region. The order of the layers may be reversed such that the p-type region is adjacent to the substrate.

Figure 1:
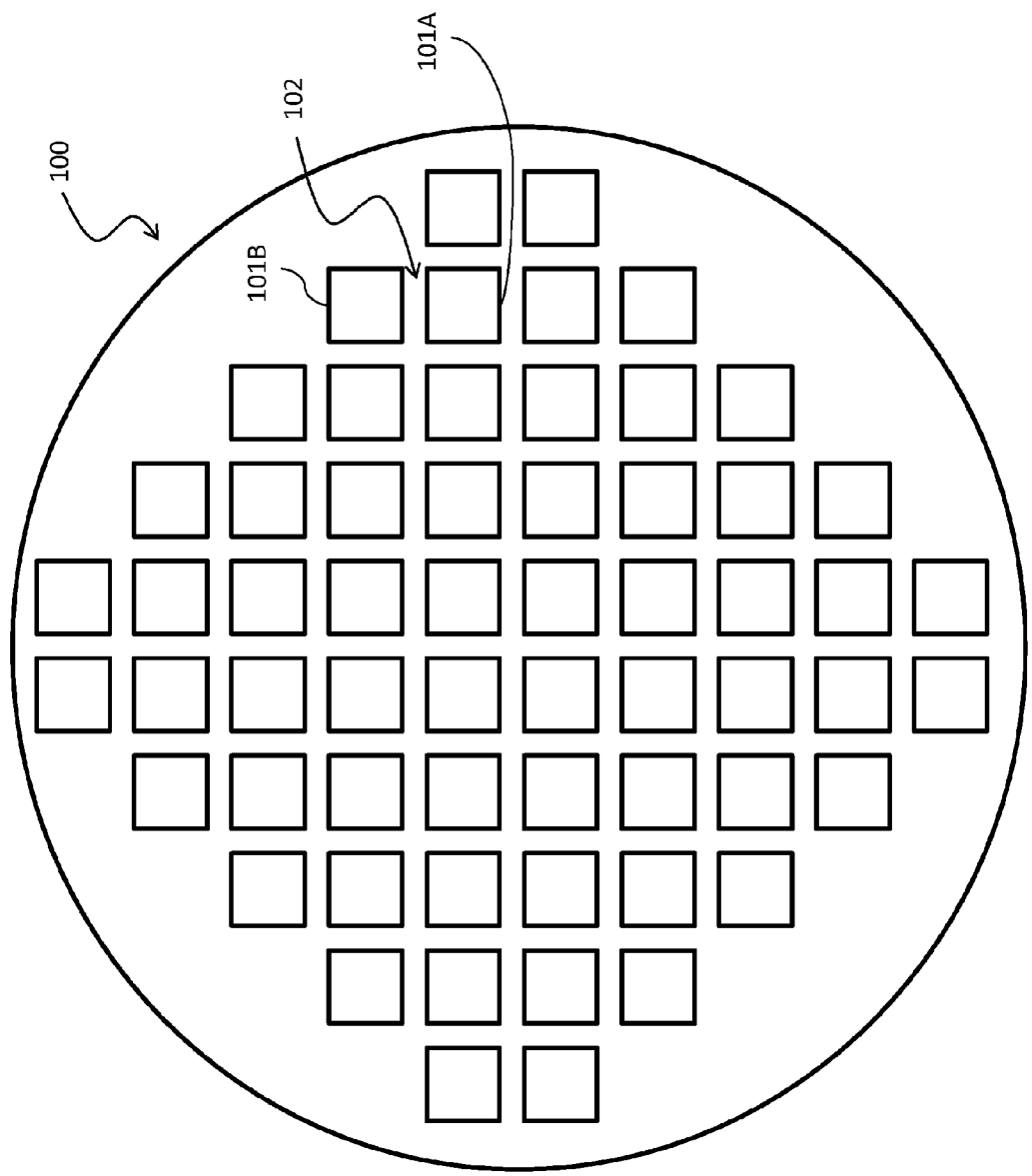
FIG. 1 is a top view of a wafer of semiconductor dice which may be LEDs.
Figure 2:
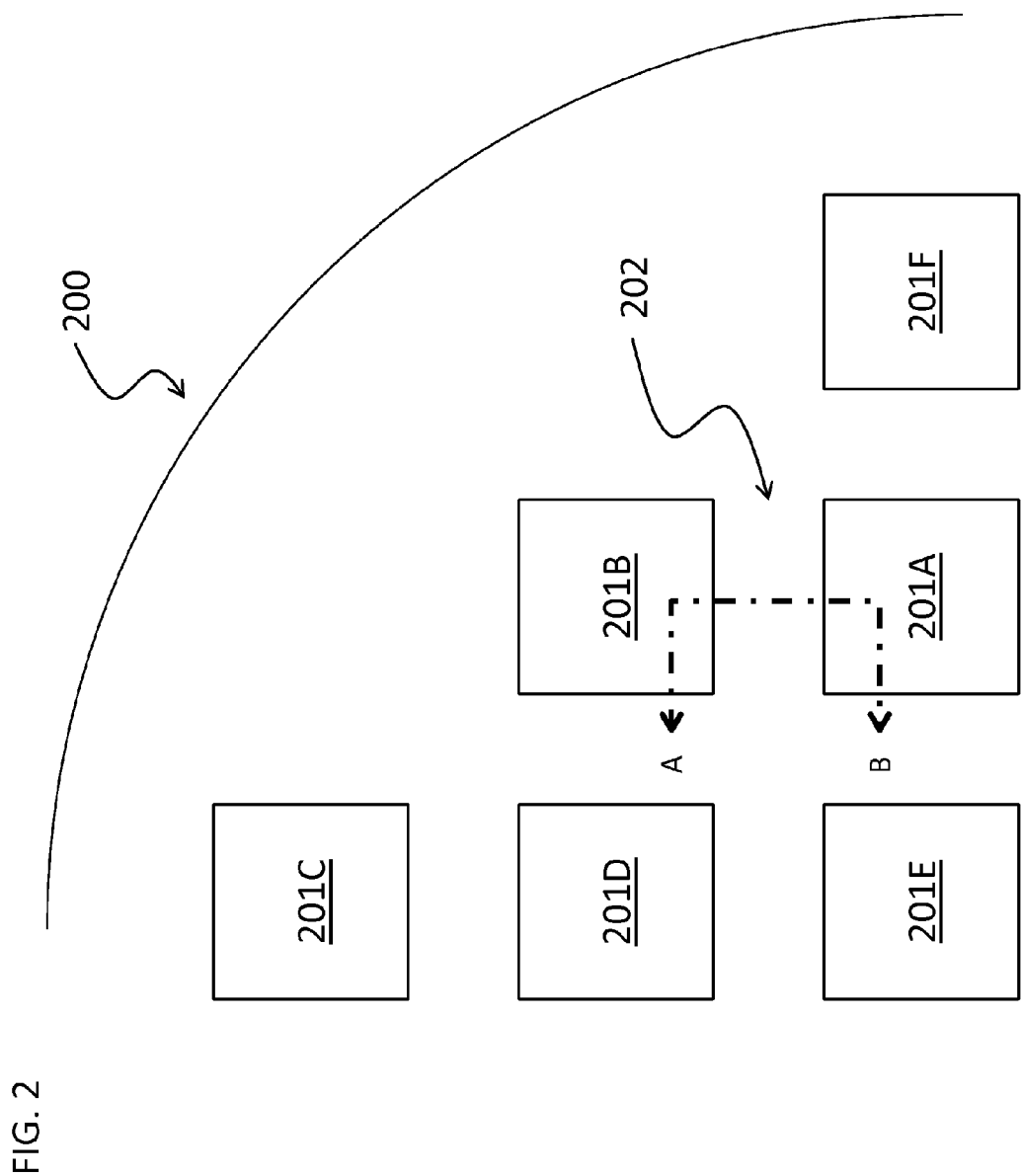
FIG. 2 is a top view of a portion of a wafer of LEDs.

FIG. 2 is a top view of a portion of a circular wafer of LED dice 200. The wafer 200 may be an epitaxial structure grown on a substrate, although numerous other methods of creating LEDs are known and are contemplated for use in the invention. In one embodiment, a p-type region is deposited on the substrate, then an active region is deposited on the p-type region, then a n-type region is deposited on the active region. In the alternative, the order of the layers may be reversed such that the p-type region is adjacent to the substrate. Likewise the layers may be grown on one substrate and then transferred to a second substrate, where the first substrate is removed by laser lift-off or any other suitable method.

In another embodiment the wafer 200 need not be circular; instead it may be rectangular, triangular, hexagonal or any other suitable shape. In another embodiment, wafer 200 may be a submount wafer and the dice may be mounted LEDs or any other suitable device.

The portion of wafer 200 includes dice 201A-201F. LEDs 201A and 201B are separated by an exemplary street 202. Line AB indicates the location of an exemplary cross section of street 202 and portions of LEDs 201A and 201B. The street area may be delineated by etching away one or more epitaxial layers of wafer 200 in one or more locations. In the alternative the wafer may be lithographically divided into devices and streets. The devices may be LEDs, lasers, solar cells, detectors, DRAM, SRAM, ROM, Flash memory, MEMS devices, microprocessors, logic gates, FPGAs or any other suitable device. The term street may refer to the area between devices, or it may refer to an area of a wafer that has been etched prior to separation. Typically the term street includes the complete horizontal or vertical areas delineated by all LED dice 201. Typically the collection of streets is a grid between dice.

FIG. 3A shows an exemplary cross section 300 at the location of line AB in FIG. 2. Wafer 200 may include one or more epitaxial layers on a substrate or bonded to a submount 313. Prior to separation, wafer 200 may be placed on a stretchable tape 350.

Exemplary epitaxial layers include n-type layer 310, active layer 311, and p-type layer 312. The exemplary street 202 shown in cross section 300 is a "U" shaped slot 321 created by etching through all of the epitaxial layers of the wafer until the substrate 313 is exposed as the bottom of the "U." Although all of the epitaxial layers are shown as etched and the substrate is not etched, other combinations such as partial etching of some or all of the epitaxial layers or of the substrate are contemplated and are included within the scope of this invention. In one embodiment (not shown) the epitaxial layers are etched through n-layer 310, active layer 311 and a portion or none of p-layer 312. "U" shaped slot 321 may define some or all of street 202. "U" shaped slot 321 may have a trapezoidal cross section as shown in FIG. 3A or any other suitable cross section e.g. rectangular, oval or an asymmetric shape.

FIG. 3A shows a portion of LED 201B on one side of "U" shaped slot 321 and a portion of LED 201A on the other side of "U" shaped slot 321. The width of street 202 may range between 2-200 micrometers. A typical size for a street between LEDs is between 20 and 75 micrometers.

Figure 3B:
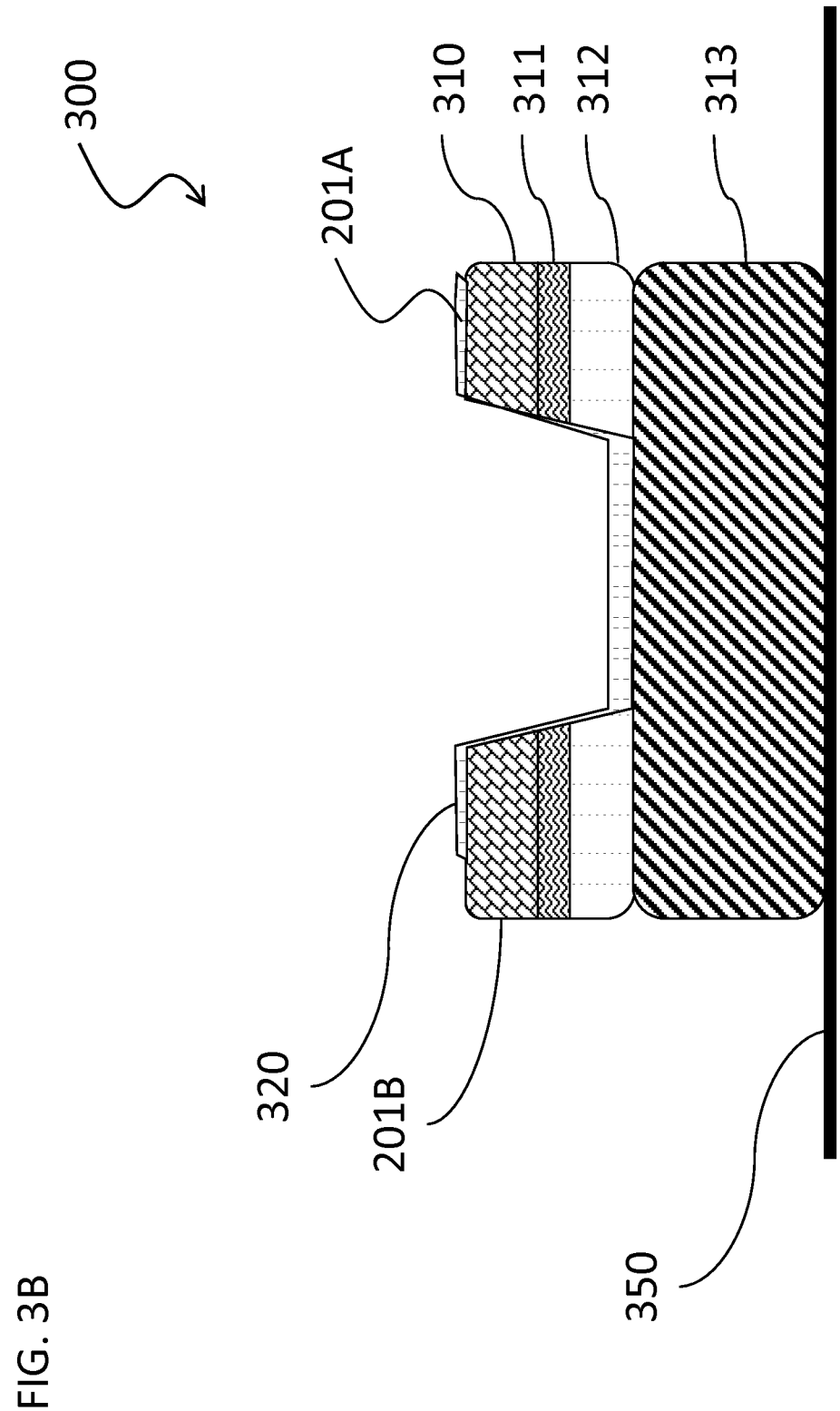
FIG. 3B shows a cross-sectional view of a wafer where a "U" shaped street has been covered with a protective coating.

FIG. 3B shows the addition of a protective layer 320 to wafer 200. Protective layer 320 may be a polymer compound that is applied as a spin-on coating. Protective coating 320 may cover some or all of the top surface of wafer 200. Typically protective coating 320 covers the walls and the bottom of slot 321 for every street and all of the top surface of the dice on the wafer. Protective coating 320 may have an even or uneven thickness across wafer 200, the walls and the bottoms of slots 321. Typically all streets and dice on the wafer will be coated in a manner similar to the exemplary cross section shown in FIG. 3B.

Figure 3C:
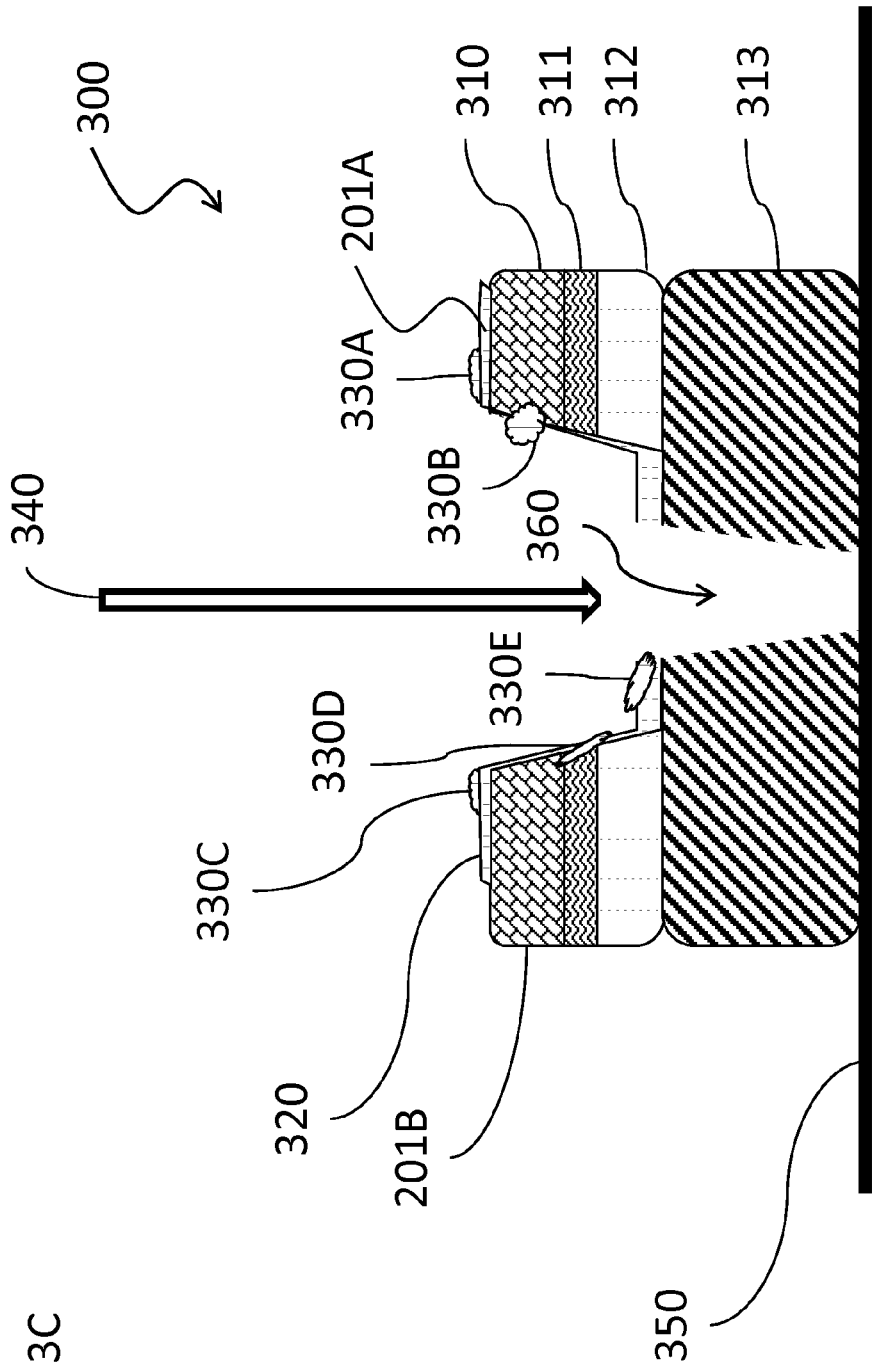
FIG. 3C shows a cross-sectional view of a wafer where a "U" shaped street has separated by a laser generating debris.

FIG. 3C shows separation of LED dice via a laser beam 340. Laser beam 340 divides substrate 313 by creating an opening or kerf 360. Kerf 360 is the portion of substrate 313 that is removed by laser 340, typically by vaporizing a portion of substrate 313. The width of kerf 360 depends on the thickness of substrate 313. A thicker substrate 313 typically has a wider kerf 360. The width of street 202 and/or "U" shaped slot 321 that provides an acceptable yield depends on the width of the kerf 360. Kerf 360 may encompass part or all of slot 321. Kerf 360 may end slightly above stretchable tape 350 leaving a portion of substrate 313 intact or kerf 360 may extend into stretchable tape 350. Kerf 360 may end in a pointed or a flat bottom. The walls of kerf 360 may be sloped. Preferably laser beam 340 divides substrate 313 without damaging stretchable tape 350. After die separation, stretchable tape 350 may be stretched to separate the LED dice for further processing.

During the division process laser beam 340 may create debris 330A-330E. Debris 330A-330E may be fragments of the substrate "calved" off substrate 313 by thermal shock or material that has been vaporized and reformed. Some debris may land on top of the protective coating 320 e.g. debris 330A, 330C and 330E. Other debris may penetrate protective coating 320 e.g. debris 330B and debris 330D.

Figure 3D:
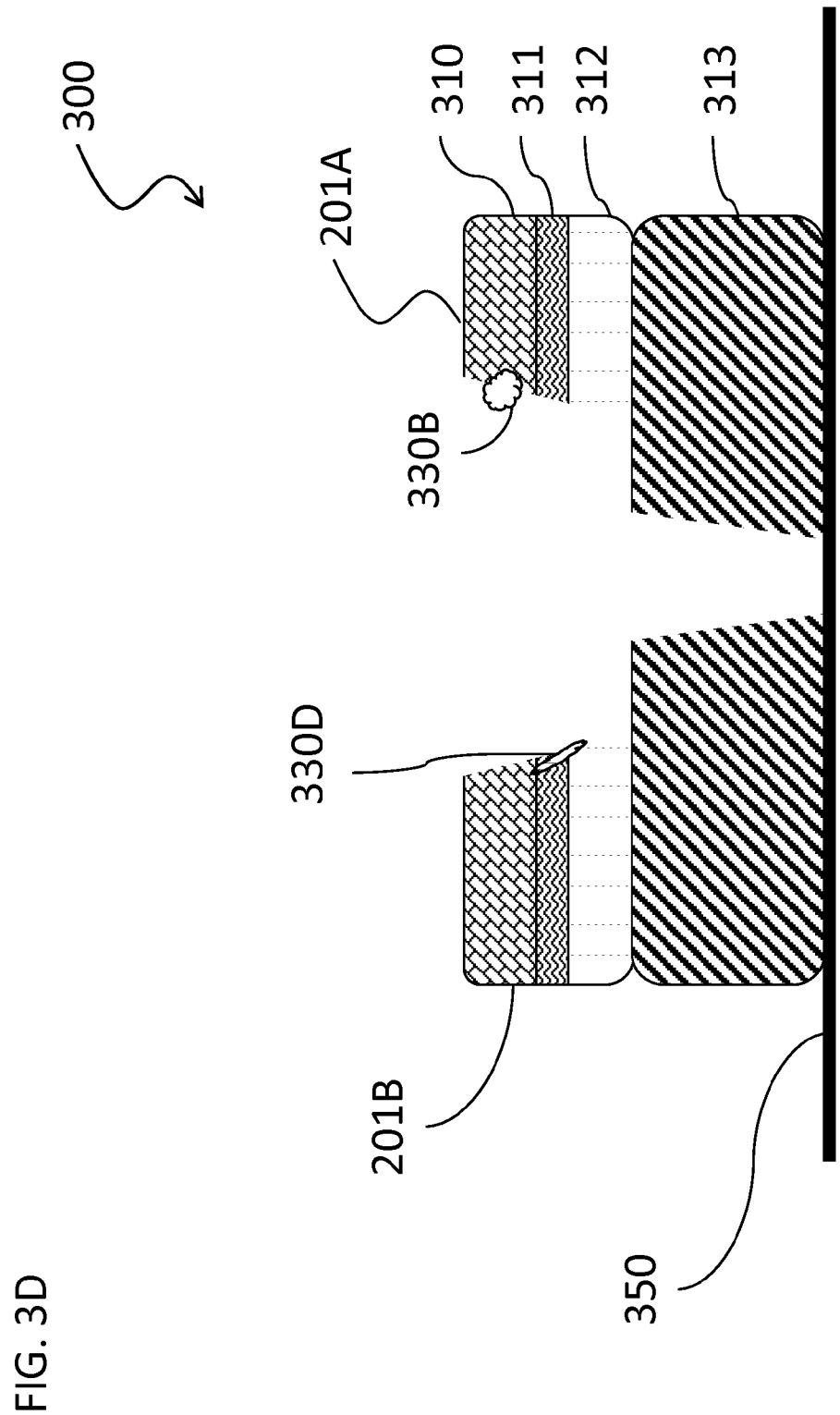
FIG. 3D shows a cross-sectional view of a wafer where devices have been damaged by penetration of the protective coating by debris.

FIG. 3D shows cross section 300 after removal of protective layer 320. Protective layer may be removed via a water washing process, by using etchants or any other suitable method. Debris 330D may remain embedded in epitaxial layers shorting LED 201B rendering it inoperable. Debris 330B may be embedded in a single layer which may degrade the performance of LED 201A. An improved process would reduce or eliminate embedded debris.

Figure 3E:
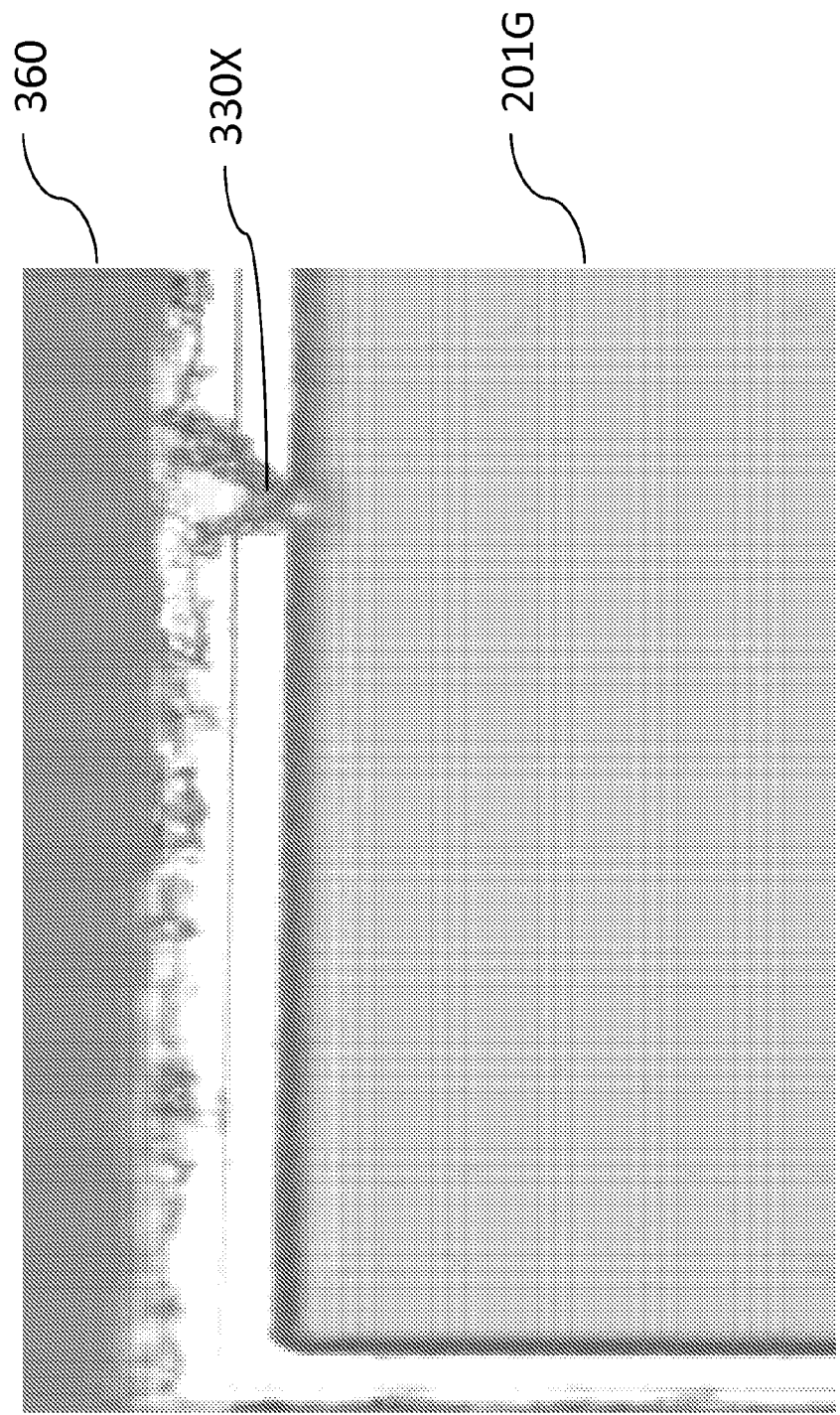
FIG. 3E shows an exemplary photograph showing damage of a die from debris.

FIG. 3E shows an exemplary photograph of a portion of a kerf 360 and a portion of an exemplary LED 201G after laser separation of a "U" shaped street. Note that debris 330X has penetrated LED 201G. It is likely that LED 201G has been destroyed or damaged by the debris.

Figure 4A:
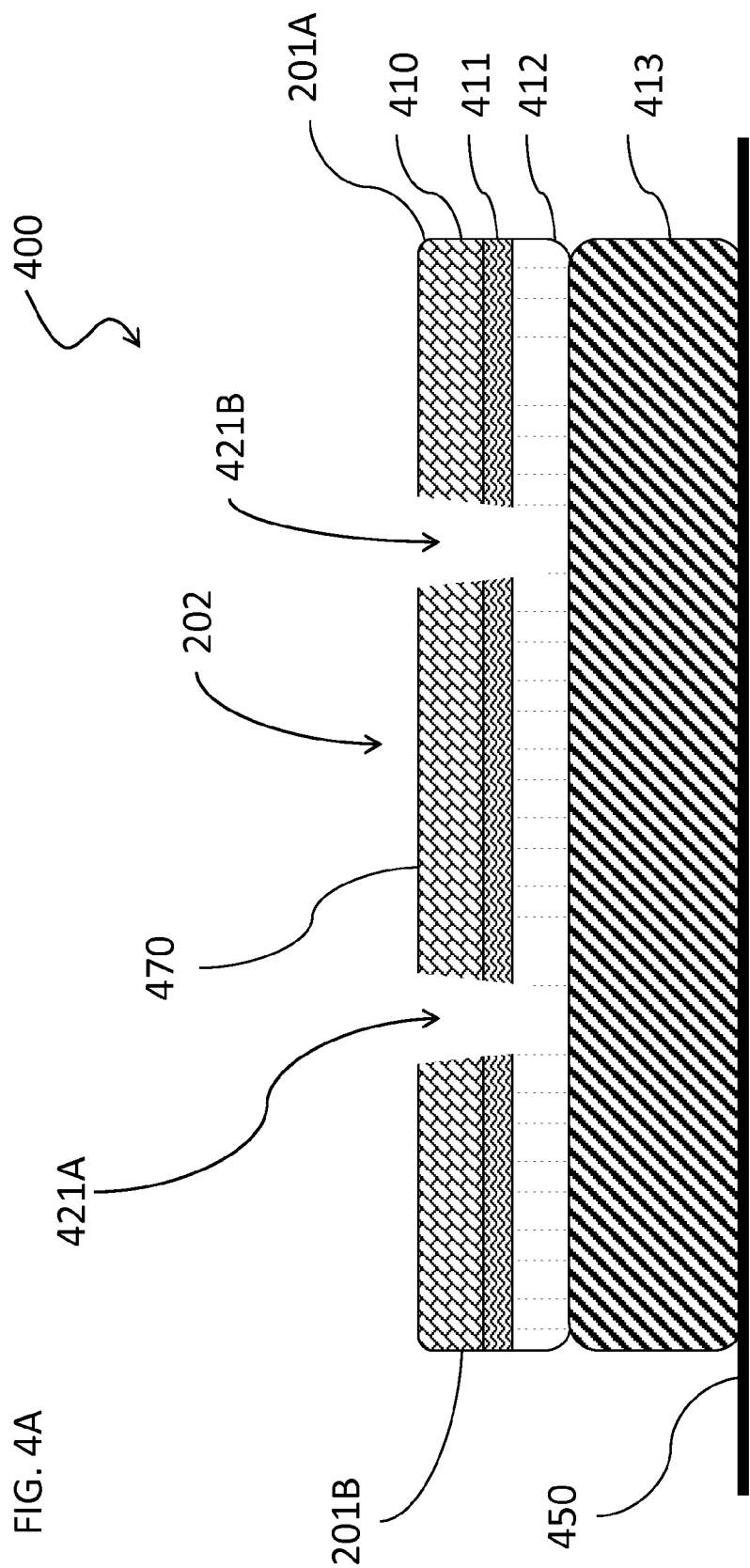
FIG. 4A shows a cross-sectional view of a wafer where a W-mesa shaped street has been etched through the epitaxial layer.

FIG. 4A shows a cross section 400 at the location of line AB of street 202 in FIG. 2. Wafer 200 may include one or more epitaxial layers on a substrate or bonded to a submount 413. Prior to separation, wafer 200 may be placed on a stretchable tape 450.

Exemplary epitaxial layers include n-type layer 410, active layer 411, and p-type layer 412. The exemplary street 202 shown in cross section 400 is a "W" shaped street created by etching through all of the epitaxial layers of the wafer until the substrate 413 is exposed as the bottom of two slots 421A and 421B. Slots 421A and 421B may electrically isolate device 201A from device 201B.

Although all of the epitaxial layers are shown as etched and the substrate is not etched, other combinations such as partial etching of some or all of the epitaxial layers or of the substrate are contemplated and are included within the scope of this invention. In one embodiment (not shown) the epitaxial layers are etched through n-layer 410, active layer 411 and a portion or none of p-layer 412. The portion of the street between the slots is mesa 470. The collection of the slots 421A, 421B and mesa 470 form a W-mesa.

Slots 421A and 421B may define some or all of street 202 i.e. the width of the street 202. Although two slots are shown, three or more slots are contemplated and are included within the scope of the invention. Although slots 421A and 421B are shown as having a trapezoidal cross section as shown in FIG. 4 any other suitable shapes e.g. rectangular or oval are contemplated and are included within the scope of the invention. Likewise, although slots 421A and 421B are shown with symmetrical cross sections and as identical, asymmetric cross sections and different cross sections for each of the slots are contemplated and are included within the scope of the invention.

FIG. 4A shows a portion of LED 201B on one side of street 202 adjacent to slot 421A. A portion of LED 201A is shown on the other side of street 202 adjacent to slot 421B. Typically no portion of LEDs 201A and 201B are located between slots 421A and 421B. The width of street 202 may range between 2-200 micrometers. A typical size for an LED street is between 20 and 75 micrometers. Typically street 202 is not widened to accommodate the W-mesa when compared to the width of a street utilizing a "U" shape.

Figure 4B:
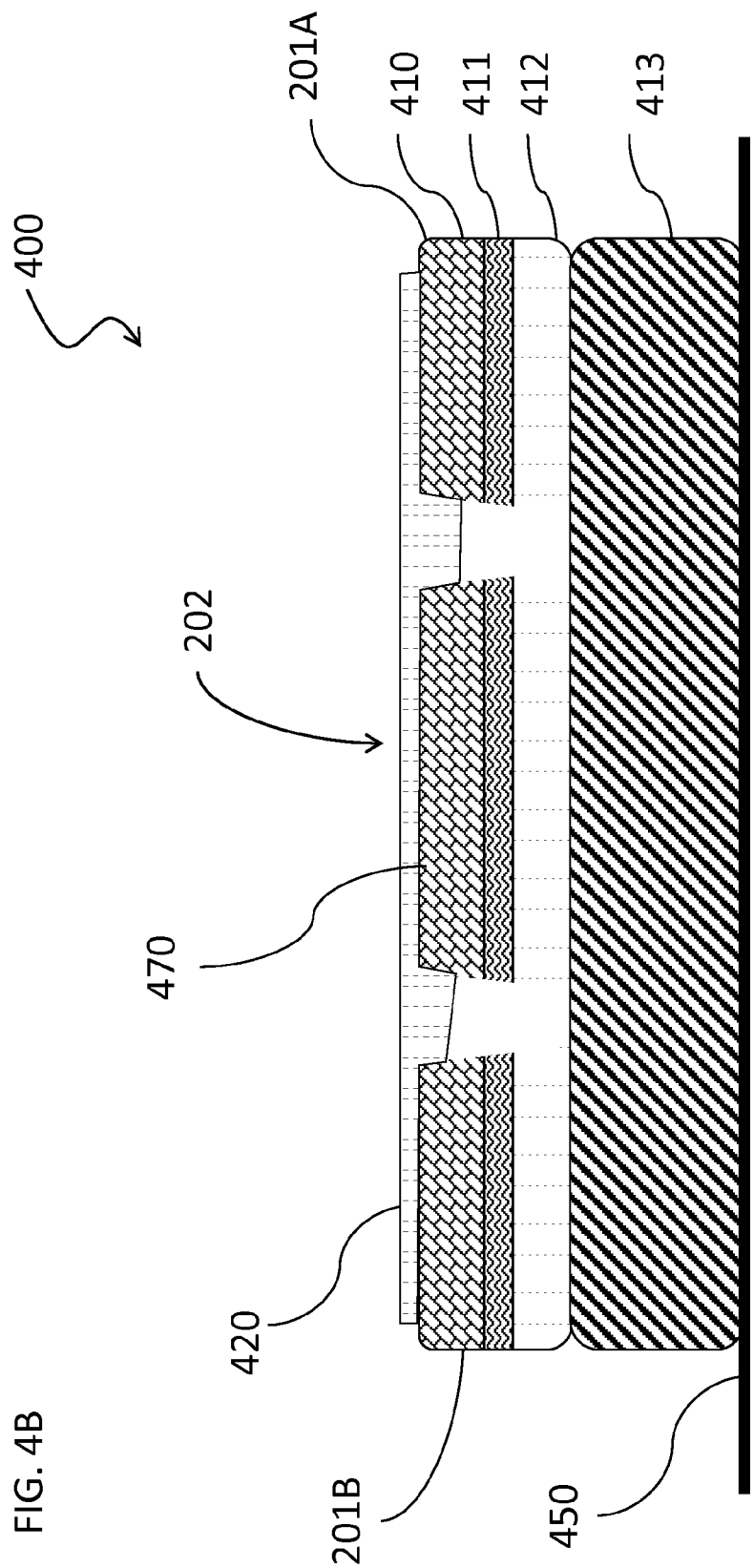
FIG. 4B shows a cross-sectional view of a wafer where a W-mesa shaped street has been covered with a protective coating.

FIG. 4B shows the addition of a protective layer 420 to wafer 200. Protective layer 440 may be a polymer compound that is applied as a spin-on coating. Protective coating 420 may cover some or all of the top surface of wafer 200. Ideally protective coating 420 forms a layer over the tops of slots 421A and 421B. Protective coating may fill or partially fill slots 421A and 421B. Protective coating 420 may have an even or uneven thickness across wafer 200. In an alternative embodiment protective coating 420 may have an even or uneven thickness across the walls and the bottoms of slots 421A and 421B. Typically all streets and dice on the wafer will be coated in a manner similar to the exemplary cross section shown in FIG. 4B.

Figure 4C:
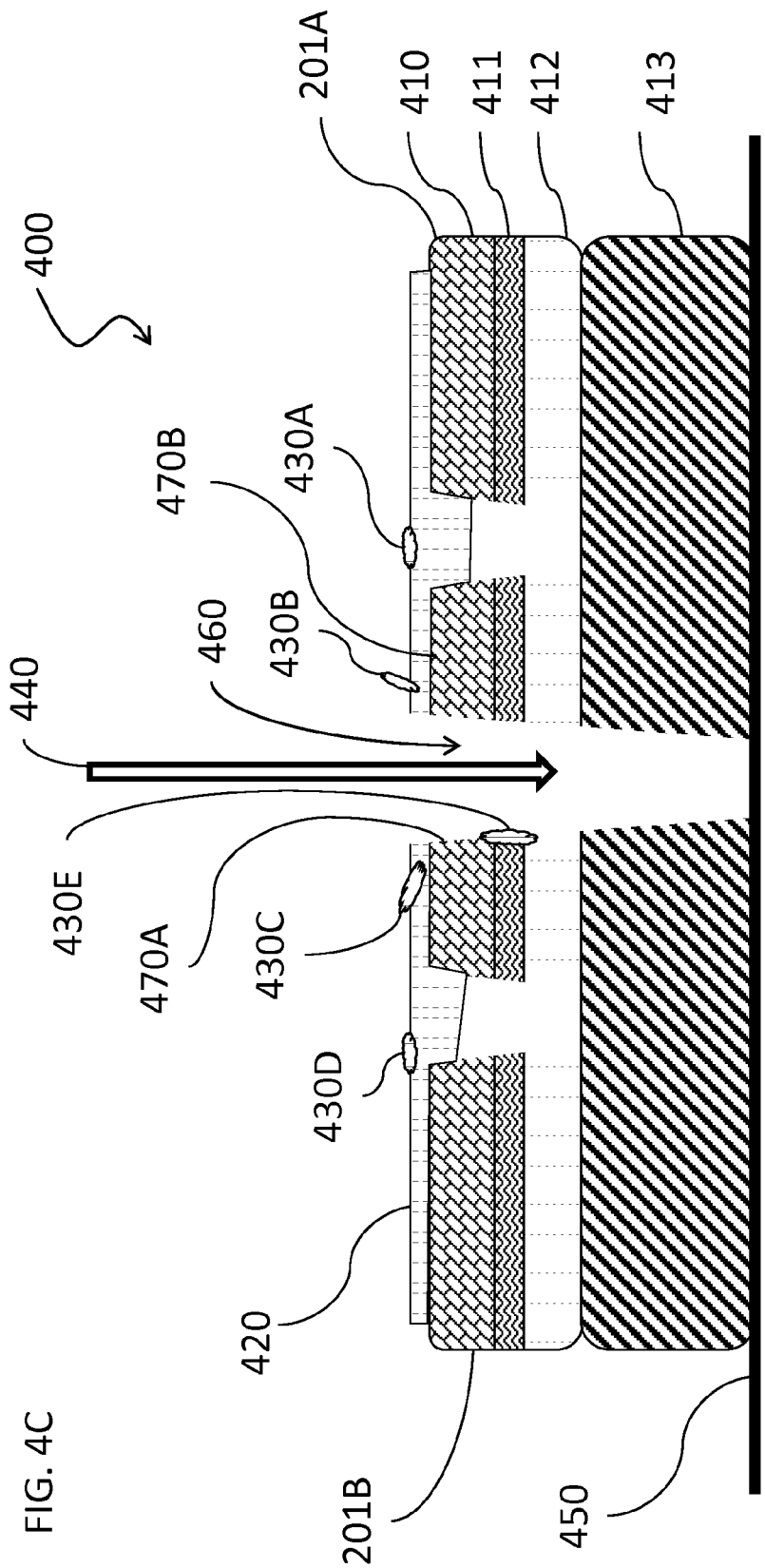
FIG. 4C shows a cross-sectional view of a wafer where a W-mesa shaped street has been separated by a laser generating debris.

FIG. 4C shows separation of LED dice via a laser beam 440. Laser beam 440 divides wafer 200 by creating an opening or kerf 460. Kerf 460 is the portion of substrate 413 and epitaxial layers 410, 411, 412 that are removed by laser 440. Typically kerf 460 is created, typically by vaporizing a portion of wafer 202 including portions of epitaxial layers 410, 411, 412 and substrate 413. Kerf 460 also divides mesa 470 into two portions, 470A and 470B.

The width of kerf 460 depends on the thickness of wafer 200. A thicker wafer 200 typically has a wider kerf 460. The width of street 202 that provides an acceptable yield depends on the width of the kerf 460. Preferably kerf 460 encompasses part of mesa 470. Kerf 460 may end slightly above stretchable tape 450 leaving a portion of substrate 413 intact or kerf 460 may extend into stretchable tape 450. Kerf 460 may end in a pointed or a flat bottom. The walls of kerf 460 may be sloped. Preferably laser beam 440 divides substrate 413 without damaging stretchable tape 450. After die separation, stretchable tape 450 may be stretched to separate the LED dice for further processing.

During the division process laser beam 440 may create debris 430A-430E. Debris 430A-430E may be fragments of the substrate "calved" off epitaxial layers 410, 411, 412 and substrate 413 by thermal shock or material that has been vaporized and reformed. Some debris may land on top of the protective coating 420 e.g. debris 430A-430D. Some portions of debris may become embedded in a portion of mesa 470, e.g. debris 430E in 470A.

FIG. 4D shows cross section 400 after removal of protective layer 420. Protective layer may be removed via a water washing process, by using etchants or any suitable method. None of the debris remains on wafer 200. However, some portion of debris may remain embedded or fused into a portion of mesa 470 e.g. debris 430E in 470A. This debris does not harm a device e.g. 201B because the mesa portions 470A, 470B are not eclectically connected to the any device. Thus the mesa portions 470A, 470B protect the devices 201A, 201B electrically and mechanically.

In an alternative embodiment, mesa portions 470A, 470B may be removed leaving a "U" shaped street. Removal of mesa portions 470A, 470B may also remove any debris embedded mesa portions 470A, 470B.

Figure 4E:
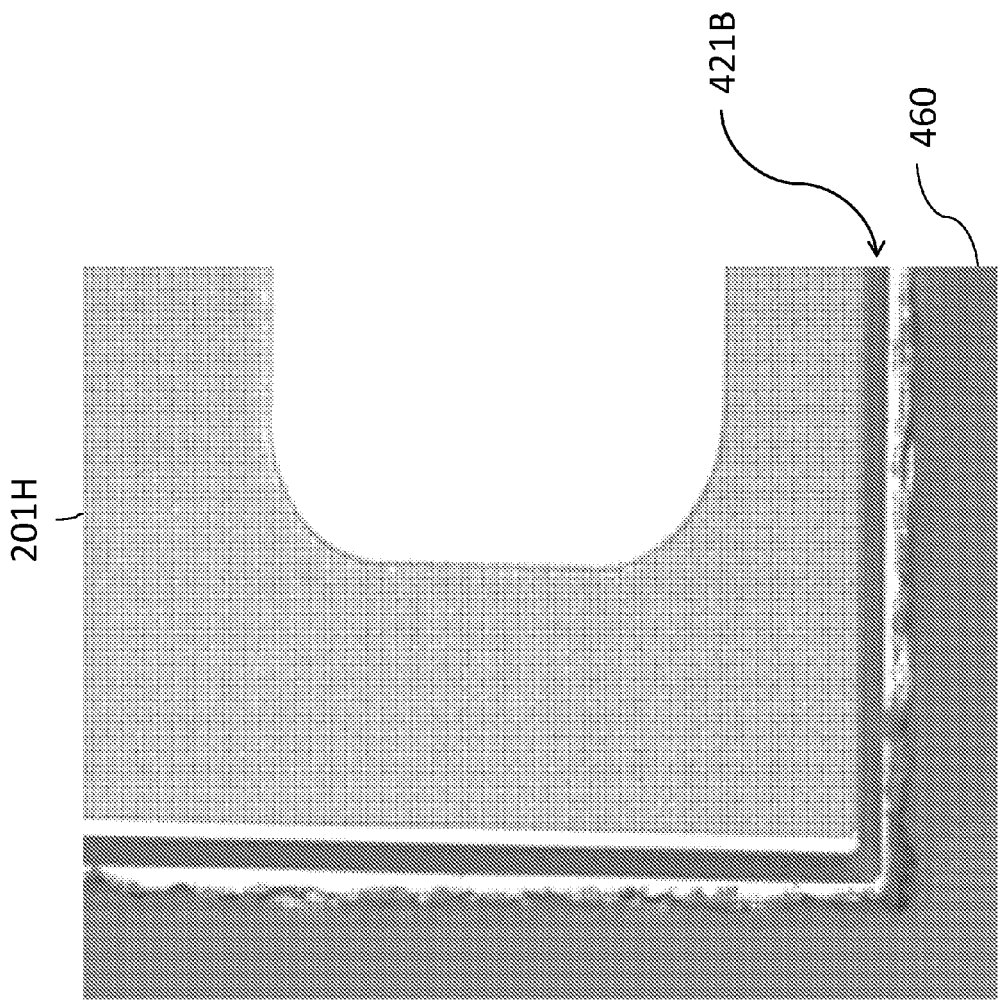
FIG. 4E shows an exemplary photograph showing protection of a die from debris by a W-mesa.

FIG. 4E shows a photograph of a portion of a kerf 460 and a portion of an exemplary LED 201H. Note that no debris 330 has penetrated LED 201H.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A method for fabricating a semiconductor structure, comprising:
  designating a street between a first portion of a wafer and a second portion of the wafer, wherein the street has a center, a first side and a second side;
  forming at least two slots in the wafer,
  wherein a first slot is formed between the first side of the street and the center of the street and a second slot is formed between the second side of the street and the center of the street,
  wherein the first slot has an inner wall directly abutting a first electrical device formed in the wafer and an outer wall facing the center of the street;
  wherein the second slot has an inner wall directly abutting a second electrical device formed in the wafer and an outer wall facing the center of the street;
  wherein the first slot and the second slot electrically isolate the first electrical device and the second electrical device from the center of the street;
  at least partially filling the first slot and the second slot with a protective material;
  cutting along the center of the street, for at least partially singulating the wafer, while leaving a first portion of the wafer between the outer edge of the first slot and the center of the street and while leaving a second portion of the wafer between the outer edge of the second slot and the center of the street; and
  removing the protective material from the first slot and the second slot.

2. The method of claim 1, wherein the wafer comprises one or more epitaxial layers on a substrate.

3. The method of claim 2, wherein the forming the slots includes penetrating all of the epitaxial layers and a portion the substrate.

4. The method of claim 2, wherein the semiconductor structure is an LED wherein at least one of the epitaxial layers is an active layer wherein forming the slots includes penetrating the active layer completely.

5. The method of claim 1 wherein the wafer is divided into a plurality of dice with a street surrounding each die.

6. The method of claim 1, further comprising dividing the wafer between the first slot and the second slot.

7. The method of claim 1, wherein cutting along the center of the street comprises cutting along the center of the street using a laser.

* * * * *